(12) United States Patent
Barabash et al.

(10) Patent No.: US 9,245,941 B2
(45) Date of Patent: Jan. 26, 2016

(54) ELECTRODE FOR LOW-LEAKAGE DEVICES

(71) Applicant: Intermolecular, Inc., San Jose, CA (US)

(72) Inventors: Sergey Barabash, San Jose, CA (US); Mankoo Lee, Fremont, CA (US); Dipankar Pramanik, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 104 days.

(21) Appl. No.: 14/140,807

(22) Filed: Dec. 26, 2013

(65) Prior Publication Data

US 2014/0273427 A1 Sep. 18, 2014

Related U.S. Application Data

(60) Provisional application No. 61/779,170, filed on Mar. 13, 2013.

(51) Int. Cl.
*H01L 21/28* (2006.01)
*H01L 49/02* (2006.01)
(Continued)

(52) U.S. Cl.
CPC .......... *H01L 28/60* (2013.01); *H01L 21/02186* (2013.01); *H01L 21/02356* (2013.01); *H01L 21/28229* (2013.01); *H01L 21/02156* (2013.01); *H01L 21/28088* (2013.01); *H01L 27/1085* (2013.01); *H01L 2924/0134* (2013.01); *H01L 2924/0533* (2013.01); *H01L 2924/05341* (2013.01); *H01L 2924/10671* (2013.01)

(58) Field of Classification Search
CPC .................. H01L 21/02156; H01L 21/02186; H01L 21/28088; H01L 27/1085; H01L 28/60; H01L 2924/0134; H01L 2924/05341; H01L 2924/0533

USPC ............................ 505/237, 238, 701; 438/591
See application file for complete search history.

(56) References Cited

U.S. PATENT DOCUMENTS 6,107,136 A * 8/2000 Melnick .................. H01L 28/91
257/306
6,600,185 B1 7/2003 Tani et al.
(Continued)

FOREIGN PATENT DOCUMENTS

WO WO 2011/138958 * 11/2011 ............ H01L 21/336

OTHER PUBLICATIONS

Watson et al.; Destruction of superconductivity in the narrow-band metal K3C60; Feb. 1, 1997; Physical Review B, vol. 55, No. 6; The American Physical Society; pp. 3866-3869.
(Continued)

*Primary Examiner* — Mary Wilczewski

(57) ABSTRACT

A YBCO-based conductive material can be used as an electrode, which can contact a dielectric such as a high k dielectric. Alternatively, a material with a narrow conduction band can be used as an electrode, which can contact a dielectric such as a high k dielectric. By aligning the dielectric with the band gap of the YBCO-based electrode or with the band gap of the narrow-band conductive material electrode, e.g., the conduction band minimum of the dielectric falls into one of the band gaps of the YBCO-based or narrow-band conductive material, thermionic leakage through the dielectric can be reduced, since the excited electrons or holes in the electrode would need higher thermal excitation energy to overcome the band gap before passing through the dielectric layer.

5 Claims, 10 Drawing Sheets

(51) Int. Cl.
*H01L 21/02* (2006.01)
*H01L 27/108* (2006.01)

(56) References Cited

U.S. PATENT DOCUMENTS

| | | | | |
|---|---|---|---|---|
| 6,613,677 | B1 * | 9/2003 | Herbots | H01L 21/02052 257/629 |
| 6,998,307 | B2 | 2/2006 | Sell et al. | |
| 7,045,815 | B2 * | 5/2006 | Yu | H01L 21/28194 257/43 |
| 2003/0201478 | A1 | 10/2003 | Tani et al. | |
| 2003/0201495 | A1 * | 10/2003 | Doderer | H01L 49/003 257/347 |
| 2004/0160812 | A1 * | 8/2004 | Rinerson | G11C 11/5678 365/158 |
| 2008/0293577 | A1 * | 11/2008 | Wong | H01L 39/143 505/230 |
| 2010/0202254 | A1 * | 8/2010 | Roest | B06B 1/0292 367/180 |
| 2010/0239794 | A1 * | 9/2010 | Andrews | H01L 51/0013 428/32.72 |
| 2012/0281452 | A1 * | 11/2012 | Huo | H01L 27/2463 365/148 |
| 2013/0240871 | A1 * | 9/2013 | Shimoda | B41J 2/161 257/43 |
| 2014/0273427 | A1 * | 9/2014 | Barabash | H01L 28/60 438/591 |
| 2015/0093841 | A1 * | 4/2015 | Shimoda | B41J 2/161 438/3 |

OTHER PUBLICATIONS

Krakauer et al.; Analysis of Electronic Structure and Charge Density of the High-Temperature Superconductor YBa2Cu3O7; 1988; Journal of Superconductivity, vol. 1, No. 1; Plenum Publishing Corporation; pp. 111-141.

Koshida et al.; Work Function of High-Tc Superconductor, YBa2Cu3O7; Sep. 1990; Japanese Journal of Applied Physics, vol. 29, No. 9; pp. 1635-1637.

\* cited by examiner

ELECTRODE FOR LOW-LEAKAGE DEVICES

CROSS REFERENCE TO RELATED APPLICATION

This application claims priority to Provisional Application Ser. No. 61/779,170, filed on Mar. 13, 2013, which is herein incorporated by reference for all purposes. This application is related to application Ser. No. 13/722,931, filed on Dec. 20, 2012, and application Ser. No. 13/728,026, filed on Dec. 27, 2012, each of which is herein incorporated by reference for all purposes.

FIELD OF THE INVENTION

This invention relates generally to electrodes, and more particularly, to electrodes for memory devices and transistor gate stacks.

BACKGROUND

Memory elements are used in electronic systems, including volatile memories such as dynamic random access memory (DRAM), or non volatile memory such as electrically-erasable programmable read only memory (EPROM). A memory element can include a dielectric layer sandwiched between two conductor layers, acting as electrodes for the memory element.

Transistor gate stacks are used in metal-oxide-semiconductor field-effect transistors (MOSFETs), such as those used in electronic systems, including transistors with a thin semiconductor "fin" channel (FinFETs) and multiple gate FETs. A typical MOSFET gate stack can comprise a conductor layer, acting as a gate electrode, and a dielectric layer sandwiched between the gate electrode and a semiconductor acting as a channel or as a part of source and/or drain.

Electric leakage currents can flow through dielectric layers and can degrade the performance and/or limit the functionality of memory elements and/or MOSFETs. The leakage levels depend both on the material(s) including the dielectric layer and the conductor layer adjacent to the dielectric layer.

Requirements for the thickness of a dielectric layer in advanced semiconductor devices can lead to significant tunneling leakage. Thus high-dielectric constant (high k) materials, e.g., materials having a dielectric constant that is higher than that of the silicon dioxide, have been recently used. A challenge for the high k dielectric is to minimize the leakage current, e.g., to achieve a leakage current similar to that of silicon dioxide.

The leakage via dielectric layers can come from two main sources: tunneling of the electrons with energies in the range between the two Fermi energies of the two electrodes (the two Fermi energies having been separated by the finite voltage across the capacitor), and the propagation of thermionic excitations.

The electronic thermion excitations propagate easily (often nearly ballistically) if their energies exceed the electron Schottky barrier, approximately equal to the conduction band offset $b_{CBM}$ of the dielectric relative to the unbiased Fermi level. There also exist thermionic hole excitations that propagate if their energies are below the hole Schottky barrier, approximately equal to the valence band offset $b_{VBM}$ relative to the unbiased Fermi level. The thermionic currents are exponentially small in the value of the barriers $b_{CBM}$ and $b_{VBM}$, e.g., proportionally to $\exp(b_x/kT)$ with $b_x$ being $b_{CBM}$ or $b_{VBM}$.

The values of $b_{CBM}$ and $b_{VBM}$ depend on material properties, including the properties of the dielectric material such as the electron affinity, the band gap, the interfacial charge neutrality level (also known as the pinning level), and the pinning strength, and the electrode properties including the effective work function of the electrode. Typically, $b_{CBM} < b_{VBM}$. Thus, electronic excitations are typically the main source of the thermionic leakage.

The tunneling currents can have a different exponential dependence on the band gap value, such as $$e^{d\sqrt{kb_{CBM}}} \text{ or } e^{d\sqrt{kb_{VBM}}}$$

in case of direct tunneling under flat-band conditions, where d is the material thickness and k is a numerical constant. Other mechanisms exhibiting more complex exponential dependence, e.g. those involving both tunneling and electron-phonon scattering (such as trap-assisted tunneling mechanism), can also contribute to leakage, for example in materials containing defects or impurities.

Reduction of tunneling leakage can be achieved by using a high-k material of increased equivalent thickness d, e.g., using materials having very high dielectric constant values. However, very high k strongly correlates with low value of the dielectric band gap, $b_{CBM} + b_{VBM}$. On the other hand, thermionic leakage becomes dominant if one or both barriers $b_{CBM}$ and $b_{VBM}$ are low, and/or the temperature T is high, and/or the dielectric thickness d is large. Thus, attempts to optimize the dielectric material to decrease tunneling often lead to an increase in thermionic leakage.

Therefore, there is a need for an electrode material that could lead to a decreased leakage, such as a decreased thermionic leakage.

SUMMARY

In some embodiments, electrode materials are disclosed that can substantially suppress leakage currents, such as by suppressing a substantial part of the thermionic leakage. Such electrode materials can contact a dielectric, such as a high k dielectric.

In some embodiments, deposition methods, and materials fabricated from those methods, are disclosed to form an interface between an electrode material and a dielectric, such that the electrode can suppress leakage currents. In some embodiments, such methods can modify the alignment of the electronic levels between an electrode and a dielectric, such as by creating a charge transfer regions or dipole layers.

In some embodiments, metallic yttrium-barium-copper oxide (YBCO) can be used as an electrode, which can contact a dielectric such as a high k dielectric. For example, YBCO materials can include $YBa_2Cu_3O_x$ with x between 6.35 and 7.0. In some embodiments, yttrium can be fully or partially substituted by a rare earth element such as La, Ce, Pr, Nd, Pm, Sm, Eu, Gd, Tb, Dy, Ho, Er, Tm, Yb, or Lu, or a mixture of these rare earth elements. For example, YBCO based materials can include $MBa_2Cu_3O_x$, wherein M comprises a single element or a mixture of elements selected from a group consisting of Y, La, Ce, Pr, Nd, Pm, Sm, Eu, Gd, Tb, Dy, Ho, Er, Tm, Yb, or Lu. The value of x can be between 6.35 and 7.0. In some embodiments, YBCO based materials can include an alloy material containing at least 50 at. % YBCO, which can be used as an electrode, and which can contact a dielectric such as a high k dielectric. The electronic band structure of YBCO or YBCO-based alloy can include a band gap, such that the Fermi level lies in the valence band below the band gap. By aligning the dielectric with the band gap of the electrode (e.g., so that the conduction band minimum of the dielectric falls into the band gap of YBCO or YBCO-based alloy material), thermionic leakage through the dielectric can be reduced, since the excited electrons or holes in the electrode would need higher thermal excitation energy to overcome the band gap before passing through the dielectric layer.

In some embodiments, the composition of YBCO or YBCO-based alloy can be selected depending on the electron affinity of the adjacent dielectric layer. In some embodiments, YBCO electrode with composition $YBa_2Cu_3O_x$ can be used, where oxygen content x can be chosen in a wide range, such as between x=6.35 and x=7.0 when the electrode contacts a dielectric with a low electron affinity, such as below 2 eV, and around or below x=6.35 when the electrode contacts a dielectric with a high electron affinity, such as above 2 eV.

In some embodiments, methods of forming an interface between YBCO electrode and a dielectric, and materials fabricated from those methods, are provided that can be configured depending on the electron affinity and the charge neutrality (pinning) level of the adjacent dielectric layer. In some embodiments, a substantially $CuO_2$-terminated YBCO electrode can contact a dielectric with a high electron affinity, such as below 2 eV, and/or with a charge neutrality (pinning) level close to the conduction band of the dielectric. In some embodiments, a Y-terminated or a mixed-composition-terminated YBCO electrode can contact a dielectric with a low electron affinity, such as below 2 eV, and with a charge neutrality (pinning) level far from to the conduction band of the dielectric.

In some embodiments, a narrow-band conductive material, such as a material with narrow conduction band, such as an impurity band or an intermediate conduction band inside a band gap, can be used as an electrode, which can contact a dielectric such as a high k dielectric. The electronic band structure of such a material can include narrow bands corresponding to the ranges of allowed energies of thermal excitations, separated by band gaps from other allowed thermionic states. By aligning the dielectric with (one of) the band gap(s) (e.g., so that the conduction band minimum, or in some embodiments the valence band maximum, of the dielectric falls into one of the band gaps of the narrow-band material), thermionic leakage through the dielectric can be reduced, since the excited electrons or holes in the electrode would need higher thermal excitation energy to overcome the band gap before passing through the dielectric layer.

In some embodiments, the composition of the narrow-band conductive material, such as the chemical identity of impurities and/or the level of doping, can be configured to move the Fermi level to within the band gap of the adjacent dielectric material.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1A:
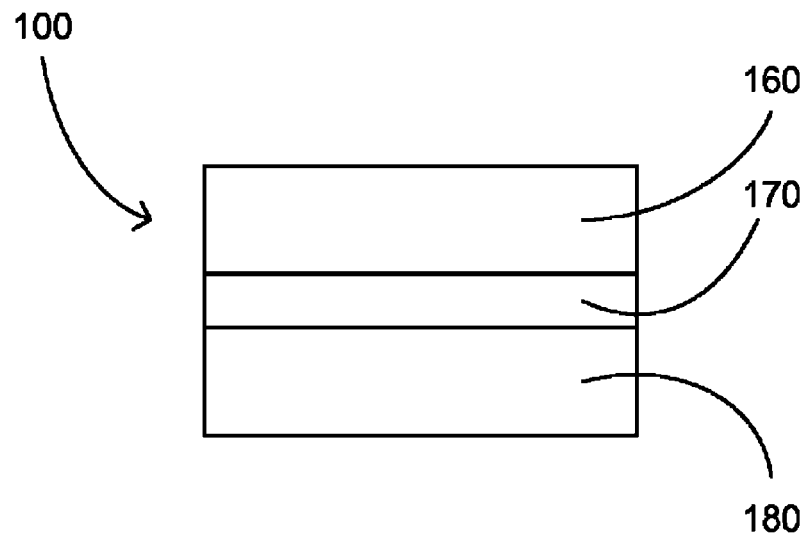
FIGS. 1A-1B illustrate configurations of electrode and dielectric according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

High k materials, such as aluminum oxide, zirconium oxide, hafnium oxide, or titanium oxide, can reduce tunneling leakage by having high physical thickness while maintaining a low effective oxide thickness. High k value can strongly correlate with low value of the dielectric band gap $E_{gap}$. The low value of the band gap limits the range of possible Schottky barriers $b_{CBM}$ and $b_{VBM}$, such that one of these barriers can be very low. A Schottky barrier can also be low due to an unfavorable combination of the electrode and dielectric properties. When a Schottky barrier is low, leakage currents can become high, and thermionic leakage can become dominant.

In some embodiments, electrode materials and electrode/dielectric stacks are disclosed that can suppress a substantial part of the thermionic leakage.

In some embodiments, the electrode can include a metallic yttrium-barium-copper oxide (YBCO) or an alloy material containing at least 50 at. % YBCO, such as over 90 at. % YBCO. For example, YBCO materials can include $YBa_2Cu_3O_x$. In some embodiments, the value of x can be between 6.35 and 7.0.

The electrode can include YBCO based materials, in which yttrium can be fully or partially substituted by a rare earth element such as La, Ce, Pr, Nd, Pm, Sm, Eu, Gd, Tb, Dy, Ho, Er, Tm, Yb, or Lu. For example, YBCO based materials can include $MBa_2Cu_3O_x$, wherein M can be a rare earth element. The value of x can be between 6.35 and 7.0. The electrode can contact a dielectric such as a high k dielectric.

The electronic band structure of YBCO or YBCO-based alloy can include a band gap, such that the Fermi level lies in the valence band below the band gap. By aligning the dielectric with the band gap of the electrode (e.g., so that the conduction band minimum of the dielectric falls into the band gap of YBCO or YBCO-based alloy material), thermionic leakage through the dielectric can be reduced, since the excited electrons or holes in the electrode would need higher thermal excitation energy to overcome the band gap before passing through the dielectric layer.

In some embodiments, the electrode can include a narrow-band conductive material, such as a material with narrow conduction band, such as an impurity band or an intermediate conduction band inside a band gap. The electronic band structure of such a material can include narrow bands corresponding to the ranges of allowed energies of thermal excitations, separated by band gaps from other allowed thermionic states. By aligning the dielectric with (one of) the band gap(s) (e.g., so that the conduction band minimum, or in some embodiments the valence band maximum, of the dielectric falls into one of the band gaps of the narrow-band material), thermionic leakage through the dielectric can be reduced, since the excited electrons or holes in the electrode would need higher thermal excitation energy to overcome the band gap before passing through the dielectric layer.

In some embodiments, the alignment process can be performed by adjusting a composition of YBCO or YBCO-based alloy material, which can result in changing the Fermi energy level and/or the band structure of the electrode, leading to the movement of the band gap of the electrode relative to the band gap of the dielectric. In some embodiments, the composition of YBCO can be selected depending on the electron affinity of the adjacent dielectric layer. In some embodiments, oxygen content x in the YBCO electrode can be chosen in a wide range, such as between x=6.35 and x=7.0 when the electrode contacts a dielectric with a low electron affinity, such as below 2 eV, and around or below x=6.35 when the electrode contacts a dielectric with a high electron affinity, such as above 2 eV.

In some embodiments, the alignment process can be performed by adjusting the composition of the narrow-band conductive material, such as the chemical identity of impurities and/or the level of doping, can be configured to move the Fermi level to within the band gap of the adjacent dielectric material.

In some embodiments, the alignment process can be performed by forming a charge transfer region, such as a dipole layer, at or near the interface between the electrode and the dielectric.

In some embodiments, methods of forming an interface between YBCO electrode and a dielectric, and materials fabricated from those methods, are provided that can result in such a charge transfer region. These methods can be configured depending on the electron affinity and the charge neutrality (pinning) level of the adjacent dielectric layer. In some embodiments, a substantially $CuO_2$-terminated YBCO electrode can contact a dielectric with a high electron affinity, such as above 2 eV, and/or with a charge neutrality (pinning) level close to the conduction band of the dielectric. In some embodiments, a Y-terminated or a mixed-composition-terminated YBCO electrode can contact a dielectric with a low electron affinity, such as below 2 eV, and with a charge neutrality (pinning) level far from to the conduction band of the dielectric.

Figure 1B:
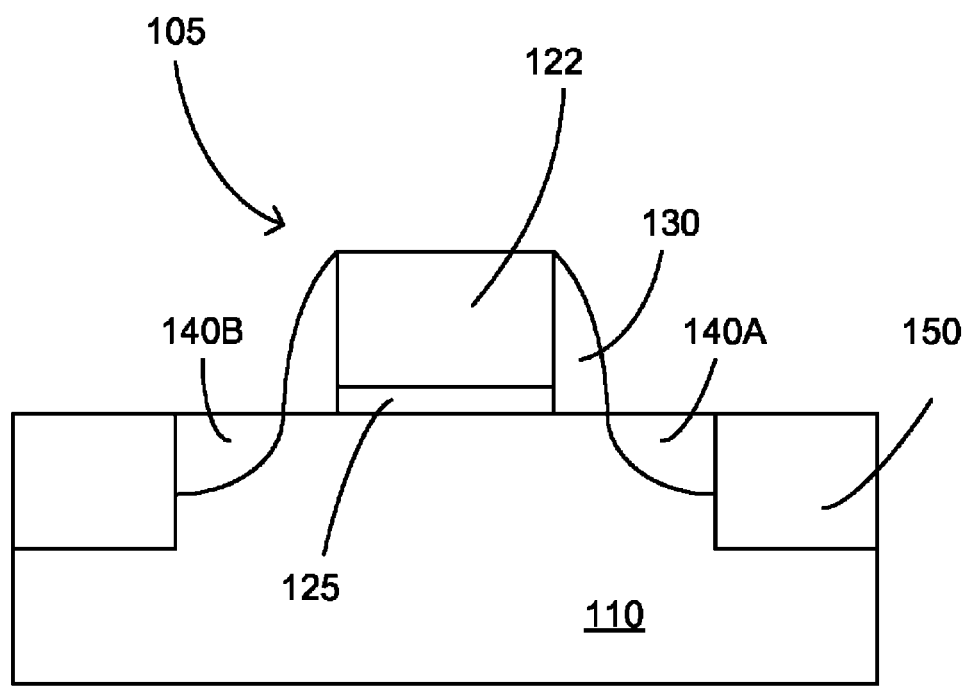

FIGS. 1A-1B illustrate configurations of electrode and dielectric according to some embodiments. In FIG. 1A, a capacitor structure 100 can include a dielectric layer 170, such as a high k dielectric layer, sandwiched between electrodes 160 and 180. When a voltage is applied to the electrodes, an electric field can be established across the dielectric layer 170. Thermionic leakage current can be present as the result of the electric field, due to the excitation of charges in the electrodes. The thermionic leakage can affect the operation of the capacitor device.

In FIG. 1B, a transistor structure 105 can be formed on a substrate 110, including isolation regions 150 to isolate the neighboring devices, source and drain regions 140A and 140B sandwiching a gate electrode 120 including a gate dielectric 125 and a gate conductor 122. Spacers 130 cover the sidewalls of the gate electrode 120. The substrate 110 can be a semiconductor substrate, or any substrates having a layer of semiconductor material. For example, the substrate 110 can be a single crystal silicon substrate. The substrate 110 can be a silicon-germanium substrate, or can have a silicon germanium layer disposed on top. The gate conductor 122 can operate as an electrode in the gate stack comprising the gate conductor 122 and the gate dielectric 125. When a voltage is applied to the gate conductor 122, an electric field can be established across the gate dielectric 125, changing the distribution of charges in the substrate 110. Thermionic leakage current can be present as the result of the electric field, due to the excitation of charges in the gate conductor. The thermionic leakage, such as leakage from the gate conductor 122 through the gate dielectric 125, can affect the operation of the transistor. FIG. 1B shows an example of a metal-oxide-semiconductor field effect transistor (MOSFET) structure 100, but the invention is not so limited, and can include any transistor structure, such as bipolar transistors, fin transistors or double gate transistors. In addition, support structures and devices can also be included, such as silicidation.

Figure 2A:
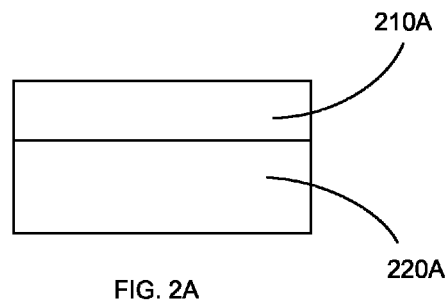
FIGS. 2A-2D illustrate a stack of electrode and dielectric according to some embodiments.
Figure 2B:
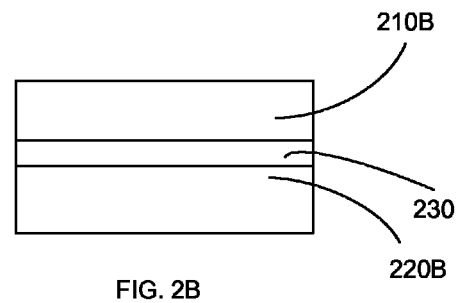
Figure 2C:
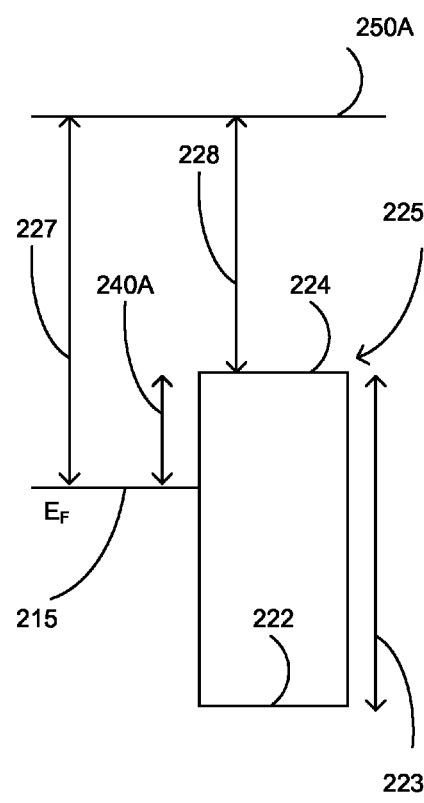

FIGS. 2A-2C illustrate a stack of electrode and dielectric according to some embodiments. In FIG. 2A, a conductive material 210A, which can operate as an electrode, can be formed on a dielectric material 220A, which can operate as a dielectric layer. In FIG. 2B, a dipole layer 230 can be formed on a dielectric material 220B, which can operate as a dielectric layer, and a conductive material 210B, which can operate as an electrode, can be formed on the dipole layer 230. One having ordinary skills in the art can recognize that the dipole layer 230 need not be formed using an additional material, but can be formed as an interfacial layer of the conductive material 210B and/or the dielectric material 220B. As such, the dipole layer can be a part of the conductive and/or dielectric material. One having ordinary skills in the art can further recognize that the orientation of the stacks shown in FIGS. 2A and 2B is only given as means of illustration. For example, the orientation can be reversed. For example, the electrode can be formed first and the dielectric can be formed last. These and all other possible orientations are encompassed. The scope is limited only by the claims.

Figure 2D:
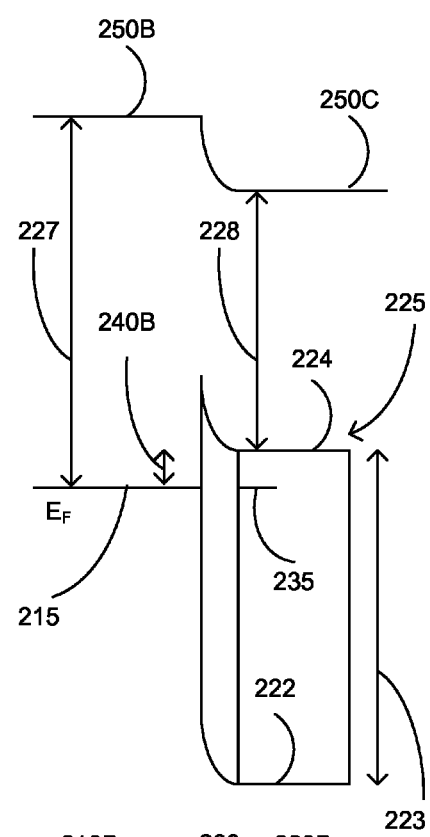

In FIGS. 2C and 2D, possible band diagrams of the electrode/dielectric stack can be shown. The diagram in FIG. 2C can correspond to the stack in FIG. 2A, and the diagram in FIG. 2D can correspond to the stack in FIG. 2B. The electrode 210A or 210B can be represented by a Fermi level $E_F$ 215. The dielectric 220A or 220B can be represented by a band gap 225, including a conduction band minimum $E_{CBM}$ 224 and a valence band maximum $E_{VBM}$ 222. The separation 223 between the conduction band minimum 224 and the valence band maximum 222 can represent the energy value of band gap of the dielectric 220. The Fermi level 215 can be represented by the effective work function 227 relative to the vacuum level 250A inside the electrode. The conduction band minimum 224 can be represented by an electron affinity 228 relative to the vacuum level 250A inside the dielectric.

FIG. 2C can show a band diagram for the case of an electrode/dielectric interface that has no interfacial dipole layers, such as in FIG. 2A. For example, this could illustrate a case of a dielectric that exhibits no (or very weak) interfacial pinning, for an interface with chemical composition that is balanced in terms of negative and positive ions in each interfacial atomic layer. When there are no interfacial dipole layers, the vacuum levels inside the electrode and inside the dielectric can have approximately the same energy 250A, so that the barrier height 240A can be roughly equal to the difference between the work function 227 and the electron affinity 228.

FIG. 2D can show a band diagram for the case of an electrode/dielectric interface that has an interfacial dipole layer 230, such as in FIG. 2B. An interfacial dipole layer can appear due to a Fermi level pinning phenomenon, or due to a misbalanced chemical composition in some of the interfacial atomic layers. The dipole layer can make the energy 250B of the vacuum level inside the electrode be substantially different from the energy 250C of the vacuum level inside the dielectric. The barrier height 240B can depend on the strength of the surface dipole. For example, when the surface dipole is created by a strong Fermi level pinning, the barrier 240B can be approximately determined by the position of the pinning level 235, which can be an interfacial charge neutrality level of the dielectric. The pinning level 235 can tend to align with the Fermi level 215 of the nearby electrode. As another example, when the interfacial dipole layer is created by a misbalanced chemical composition near the interface, the barrier 240B can increase or decrease depending on the orientation of the dipole layer, which can be determined by the charge of the prevailing ions at the electrode/dielectric interface.

Electrons from the electrode 210 can receive excitation energy, e.g., thermionic energy, to overcome the barrier height 240A/240B and become thermionic leakage current. Thus, for a typical configuration of a conductive electrode, such as a metal in contact with a dielectric, an excitation greater than the difference between the conduction band minimum 224 and the Fermi level 215, e.g., $\Delta E = E_{CBM} - E_F$, can let the electrons surpassing the barrier height 240A/240B and creating a leakage current. There is also a contribution to the thermionic leakage current from thermally excited holes that need to overcome a hole excitation barrier $\Delta E' = -(E_{VBM} - E_F)$ between the Fermi level 215 and the valence band minimum 222 in order to create a leakage current. One having ordinary skills in the art would understand that vertically flipping a band alignment diagram with respect to the Fermi level, one would interchange the characteristics related to the electron and the hole contributions (such as the electron and hole excitation barriers, $\Delta E$ and $\Delta E'$). The subsequent discussion uses the example of thermionic leakage from thermally excited electrons, however, all the cases of thermionic leakage from thermally excited electrons related by the aforementioned symmetry are encompassed.

In some embodiments, YBCO-based electrodes are disclosed, which can reduce the thermionic leakage across the dielectric. A band gap of YBCO-based electrodes can align with the conduction band minimum of the dielectric so that the electrons would require an excitation greater than $\Delta E$, e.g., greater than $E_{CBM} - E_F$, before overcoming the barrier height.

In some embodiments, YBCO based materials can include a crystalline material with a layered atomic structure, such as a distorted perovskite structure. The layered atomic structure can include multiple atomic layers. YBCO can be formed in different crystalline phases, such as depending on composition, deposition and/or annealing methods and conditions. The crystalline phases can differ in the specific sequence of layers and the symmetry of the lattice distortion relative to the ideal perovskite structure. Some YBCO phases can have composition approximately described by the chemical formula $YBa_2Cu_3O_x$. An orthorhombic Y phase can be prepared in a wide range of oxygen compositions (x in $YBa_2Cu_3O_x$), such as from x=6.35 to x=7.0. An orthorhombic phase can exhibit metallic properties. A tetragonal phase can be prepared for some compositions, such as x<=6.35. Depending on composition x, a tetragonal phase can exhibit metallic properties in a range of compositions, however, as composition approaches x=6.0, the tetragonal phase can have low conductivity or become insulating.

Figures 3A, 3B:
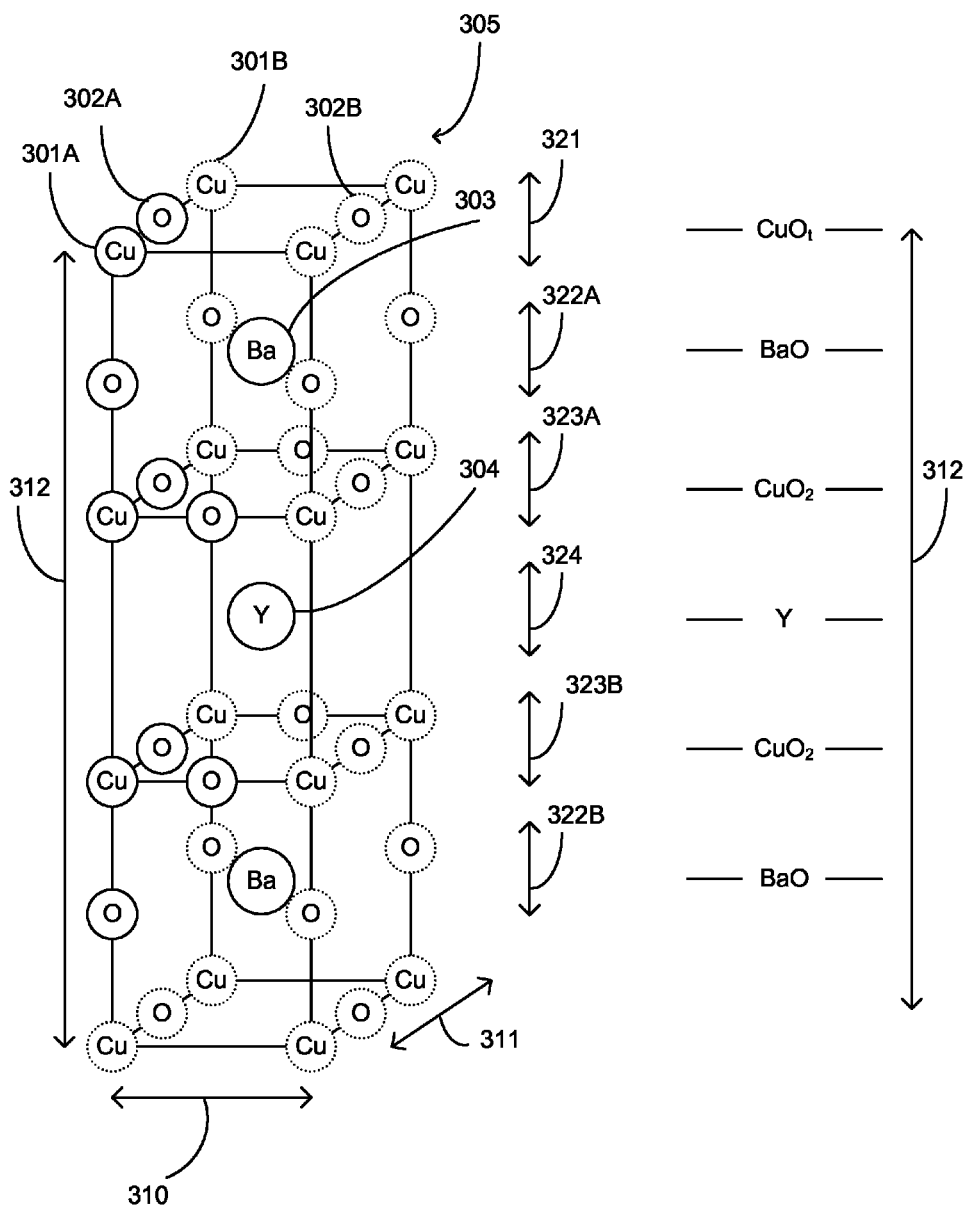
FIGS. 3A-3D illustrate YBCO structure and band diagram according to some embodiments.

FIGS. 3A-3D illustrate YBCO structure and band diagram according to some embodiments. FIGS. 3A and 3B illustrate a crystal structure that the orthorhombic YBCO phase can have. FIG. 3A illustrates the positions of atoms in YBCO. The crystal structure comprises a unit cell 305 that can be periodically repeated along the unit cell vectors, such as along vector a 310, vector b 311, or vector c 312. The crystal structure can further comprise O anions 301A, Cu cations 302A, Y cations 303, and Ba cations 304. If a unit cell 305 is periodically repeated along vectors a 310, b 311, or c 312, the atoms included into the unit cell 305 are also repeated periodically. For visual clarity, FIG. 3A shows those periodically repeated Cu cations 301B and O anions 302B that can be located at the boundaries of the unit cell 305, but does not show any repeated atoms that are located outside the boundaries of 305. Any repeated atoms such as 301B and 302B are shown using dotted outline and by convention are not considered included into the unit cell 305. Considering the stacking along the c direction 312, also known as [001] direction, the crystal structure can comprise a periodically repeated sequence of atomic layers with a specific composition, namely the sequence of a $CuO_t$ layer 321, BaO layers 322A and 322B, $CuO_2$ layers 323A and 323B, and Y layer 324. FIG. 3B illustrates the resulting periodically repeated $\{CuO_t, BaO, CuO_2, Y, CuO_2, BaO\}$ sequence of atomic layers. Such layers can be stacked in [001] direction 312 and can be called (001) layers. Note that in $CuO_t$ layers 321, oxygen 302A can be missing in some unit cells and present in others, resulting in an average oxygen composition of layer 321 equal to t=x−6, where x can be the O composition in $YBa_2Cu_3O_x$.

Figure 3C:
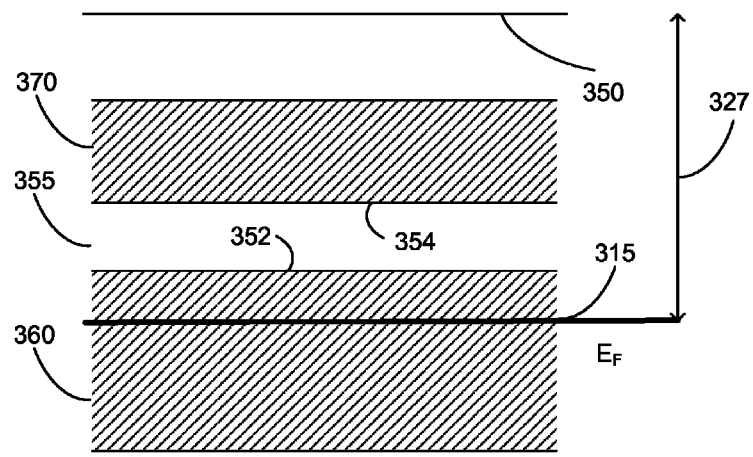
Figure 3D:
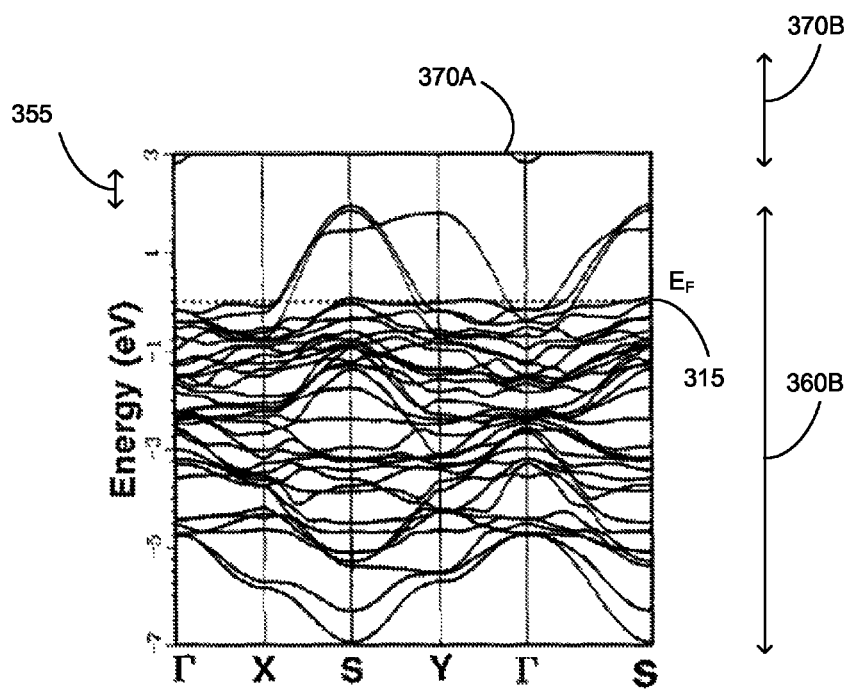

In FIG. 3C, a schematic of the energy band diagram of YBCO can be shown according to some embodiments, including the electronic bands such as the valence band 360 and the conduction band 370, separated by a band gap 310. In metallic YBCO, the Fermi level $E_F$ 315 lies in the valence band, and can be represented by the work function 327 relative to the vacuum level 350. Both the valence band maximum 352 (which we denote VBM-el) and the conduction band minimum 354 (which we denote CBM-el) lie above the Fermi level 315. More than one valence and more than one conduction band are generally present and can be separated by multiple band gaps; only two of the bands with the energies around $E_F$ 315 are shown in FIG. 3B. FIG. 3D shows a band structure diagram of $YBa_2Cu_3O_7$ around the $E_F$. The band structure diagrams can be calculated from first principles using, for example, linearized augmented plane wave method in the local density approximation (LDA), for example, as shown in Krakauer et al., J. Supercond. 1, 111 (1988). Note that only the bottom portion 370A of the conduction band is shown in FIG. 3D. In FIG. 3D, Fermi level 315 is at the zero of energy axis and is indicated by a dashed line, and both the conduction and the valence bands extend beyond the top and bottom boundaries of the figure, as schematically indicated by the arrowed lines 360B and 370B.

The naming of the electronic band containing the Fermi level of YBCO may depend on convention. The band 360 can be called a valence band because YBCO can be considered a hole doped insulating material. In some conventions, the same band 360 could be called a conduction band, recognizing that YBCO behaves as a metal. The naming convention does not affect the scope of this invention, which is limited only by the claims.

Considering FIG. 3D, one having ordinary skills in the art can note that, according to the LDA calculations, the VBM-el of YBCO can lie approximately 2 eV above the Fermi level, i.e. $E_{VBM-el} \approx E_F + 2$ eV, and CBM-el can lie approximately 2.8 eV above the Fermi level, i.e. $E_{CBM-el} \approx E_F + 2.8$ eV, and that there can be a 0.8 eV-wide band gap positioned 2 eV above $E_F$. Since the LDA calculations can typically underestimate the band gap, such as by around 40%, one having ordinary skills in the art can conclude that the true CBM-el of $YBa_2Cu_3O_7$ could be at $E_{CBM-el} = E_F + 3.2$ eV (i.e. a 1.2 eV gap). The work function of $YBa_2Cu_3O_7$ could be around 4.0 eV at x=7. Thus, for $YBa_2Cu_3O_7$, $E_{VBM-el}$ could be about 2.0 eV below the vacuum level 350 and $E_{CBM-el}$ could be about 0.8 . . . 1.2 eV below the vacuum level 350.

Figure 4A:
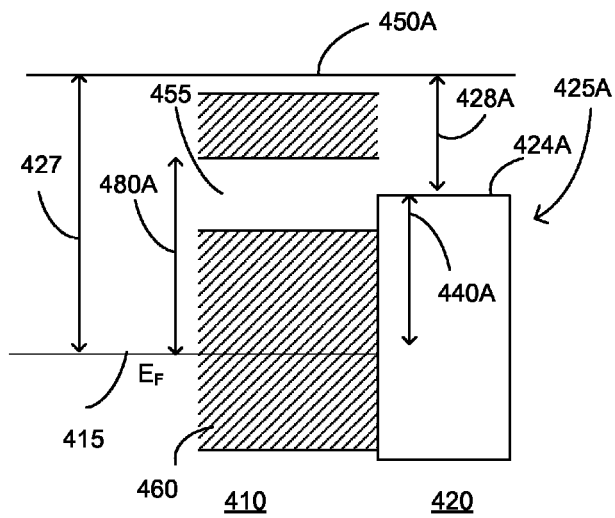
FIGS. 4A-4B illustrate YBCO electrode adjacent to a dielectric according to some embodiments.
Figure 4B:
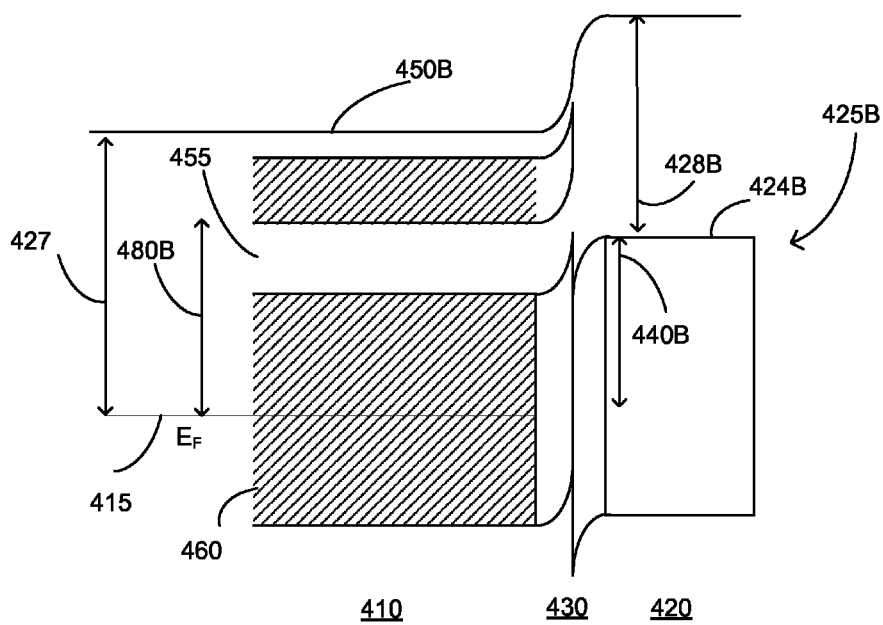

FIGS. 4A-4B illustrate a band diagram of YBCO-based electrode adjacent to a dielectric, according to some embodiments. YBCO-based electrode material 410 can be represented by a band gap 455 and a Fermi level 415 positioned inside the electrode valence band 460 at a lower energy than the band gap 455. The Fermi level 415 can be represented by the work function 427 relative to the vacuum level 450A/450B inside the electrode. The dielectric 420 can be represented by the dielectric band gap 425A/425B. The top of the dielectric band gap 425A/425B is the dielectric CBM 424A/424B, that can be represented by the dielectric affinity energy relative to the vacuum level 450A.

In FIG. 4A illustrates a band alignment for a dielectric with a relatively low dielectric electron affinity 428A. The CMB 424A of the dielectric is within the electrode band gap 455 when there is no dipole layer near the electrode/dielectric interface. The energy of the vacuum level 450A can be approximately the same in the electrode and the dielectric. Since the band gap 455 is forbidden, the electrons in the electrode valence band 460 will need at least an excitation energy 480A to pass through the dielectric 420. This excitation energy 480A is greater than the difference 440A between the conduction band minimum 424A and the Fermi level 415 (approximately given by the difference between the work function 427 and the electron affinity 428A), e.g., $\Delta E = E_{CBM} - E_F$, which is the required excitation energy for conventional conductive materials such as metals. Thus, the thermionic leakage through the dielectric 420 can be reduced, due to the requirement of higher excitation energy. The leakage can be significantly reduced, since the leakage current is exponentially proportional to the excitation energy. Other leakage mechanisms may also be suppressed in some embodiments.

FIG. 4B shows a different band alignment, such as for a dielectric with a relatively high dielectric electron affinity 428B. Because the affinity 428B is high, an additional dipole layer 430 may need to be formed. In the absence of a dipole layer 430, CBM 424B could fall within the electrode valence band 460 (this hypothetical case is not shown in the figure). The dipole layer 430 can make the vacuum level 450B to change energy between the electrode 410 and the dielectric 420, e.g. so that the dielectric CBM 424B is within the electrode band gap 455, as shown in FIG. 4B. Since the band gap 455 is forbidden, the electrons in the electrode valence band 460 will need at least an excitation energy 480B to pass through the dielectric 420. This excitation energy 480B is greater than the difference 440B between the conduction band minimum 424B and the Fermi level 415, e.g., $\Delta E = E_{CBM} - E_F$, which is the required excitation energy for conventional conductive materials such as metals in the presence of a similar dipole layer 430. Note that the difference 440B can in turn be much greater than what would be the required excitation energy for conventional materials in the absence of a dipole layer 430, which would be given by the difference between the work function 427 and the electron affinity 428B. For a dielectric with high electron affinity, the difference between the work function 427 and the electron affinity 428B can be very small, whereas the difference 440B can be larger, and the actual required thermionic excitation energy 480B can be even larger. Thus, the thermionic leakage through the dielectric 420 can be reduced, due to the requirement of higher excitation energy. The leakage can be significantly reduced, since the leakage current is exponentially proportional to the excitation energy. Other leakage mechanisms may also be suppressed in some embodiments.

The work function 437 of the electrode can depend on the exact chemical composition and the phase of the electrode material, e.g. it could be around 4 eV. The electron affinity of the dielectric could depend on the chemical identity of the dielectric, among other factors. For example, the configuration illustrated in FIG. 4A can be used when the dielectric can exhibit a weak tendency for pinning and have a low electron affinity, such as lower or around 2 eV, such as an electron affinity in the 1.0 to 1.9 eV range. In some embodiments, $ZrO_2$ could be used as a dielectric in a configuration illustrated in FIG. 4A. $ZrO_2$ can have an electron affinity around 1.6 eV. In some embodiments, $HfO_2$ could be used as a dielectric in a configuration illustrated in FIG. 4A. The configuration illustrated in FIG. 4B can be used when the dielectric can have a moderate to high electron affinity, such as $TiO_2$, such as an electron affinity exceeding 2.0 eV range rutile. In some embodiments, $TiO_2$ could be used as a dielectric in a configuration illustrated in FIG. 4B. By selecting the composition of YBCO or YBCO-based alloy, and/or by forming a dipole layer at the electrode/dielectric interface, the band structures of the electrode and the dielectric can be aligned.

The band diagram of YBCO can be changed, such as changing the shape and the relative energy of the conduction and valence bands and of the Fermi level with respect to each other and/or the vacuum energy level. Other band diagram changes are also possible, such as appearance of additional band gap(s) due to electronic correlations. In some embodiments, changing the composition x of $YBa_2Cu_3O_x$ to x<7 can change the band diagram, such as bringing both $E_{CBM-el}$ and $E_{VBM-el}$ closer to the Fermi level value $E_F$ and/or further below the vacuum level. In some embodiments, alloying YBCO with other materials can change the band diagram of YBCO.

In some embodiments, the alignment process can be performed by adjusting a composition of YBCO or YBCO-based alloy material, which can result in changing the Fermi energy level, the movement of the band structure of the electrode relative to the band structure of the dielectric. In some embodiments, the composition of YBCO is provided that can be selected depending on the electron affinity of the adjacent dielectric layer. In some embodiments, oxygen content x in the YBCO electrode can be chosen in a wide range, such as between x=6.35 and x=7.0 when the electrode contacts a dielectric with a low electron affinity, such as below 2 eV, and around or below x=6.35 when the electrode contacts a dielectric with a high electron affinity, such as above 2 eV.

Considering the stacking of the (001) atomic layers along the c direction 312 of YBCO as shown in FIG. 3B, one having ordinary skills in the art can notice that the formal charges on the $\{CuO_f, BaO, CuO_2, Y, CuO_2, BaO\}$ layers can be respectively $\{+1, 0, -2, +3, -2, \text{ and } 0\}$ per formula unit of $YBa_2Cu_3O_x$, because O can be a divalent anion, while among the cations Y can be trivalent, Ba can be divalent, and Cu valence can range from 1 to 3. For example, in insulating $YBa_2Cu_3O_6$ (i.e. x=6 or t=x−6=0), Cu can be assigned valence 2 in $CuO_2$ layers, and valence 1 in $CuO_t$ layers (i.e. in pure Cu layers because t=0) in order to balance the cation and anion valences. At other YBCO compositions, the valence of Cu in $CuO_t$ layers can be assigned to vary continuously from 1 in $YBa_2Cu_3O_6$ to 3 in $YBa_2Cu_3O_7$, leading to the aforementioned sequence of {+1, 0, −2, +3, −2, and 0} layer chargers per formula unit independent of composition. While such formal considerations can be highly approximate, they can indicate that a YBCO electrode terminated with $CuO_2$ layer can carry an excess negative surface charge (formally −2 per formula unit) at the surface. The compensating positive charge, such as a screening charge, can form inside the electrode, creating a dipole layer that can decrease the electron Schottky barrier to an adjacent dielectric. This can allow one having ordinary skills in the art to form additional dipole layers.

FIGS. 5A-5D show relative orientation of the electrode-dielectric interface and the YBCO atomic layers according to some embodiments. Specifically, FIGS. 5A-5D can show some of the possible orientations of the (001) atomic layers in YBCO-based electrode relative to the dielectric. For some orientations, a dipole layer can be formed at the electrode-dielectric interface.

Figure 5A:
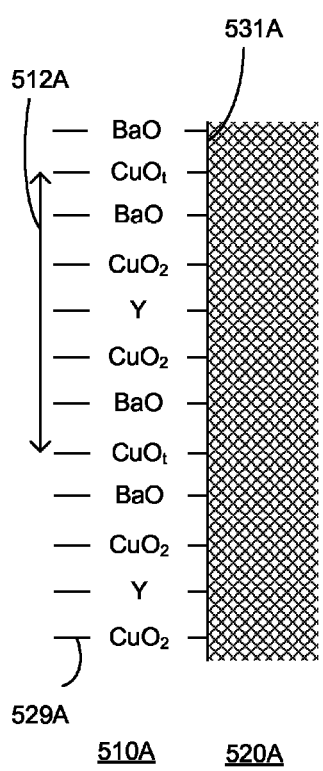
FIGS. 5A-5D illustrate relative orientation of the electrode-dielectric interface and the YBCO atomic layers according to some embodiments.

In FIG. 5A, the [001] direction 512A, e.g., the orientation, of the YBCO crystal structure can be at an angle different from 90° relative to the interface 531A between the electrode 510A and the dielectric 520A. For example, the [001] direction 512A, e.g., the orientation, can be parallel to the interface 531A. Each of the (001) atomic layers 529A can have a composition indicated in the figure. Different atomic layers 529A can terminate at the interface 531A. YBCO atoms adjacent to the interface 531A can include atoms that are included in different atomic layers. The charges of different planes can be balanced at the interface, and thus the interface shown in FIG. 5A can create no or only a weak dipole layer.

Figure 5B:
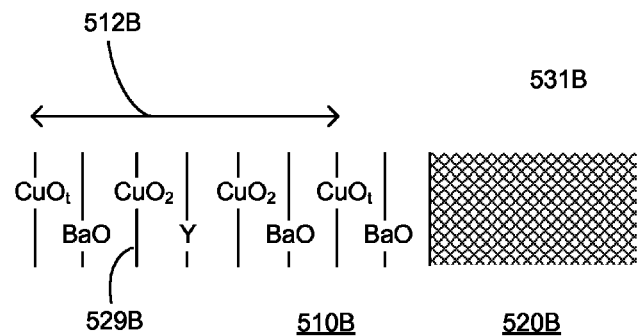

In FIG. 5B, the [001] direction 512B of the YBCO crystal structure can be substantially perpendicular, e.g., at 90° angle, relative to the interface 531B between the electrode 510B and the dielectric 520B. Each of the (001) atomic layers 529B can have a composition as illustrated in the figure. YBCO atoms adjacent to the interface 531B can be all included into a BaO layer. This layer can be formally charge-balanced, and thus the interface shown in FIG. 5B can create no or only a weak dipole layer.

Figure 5C:
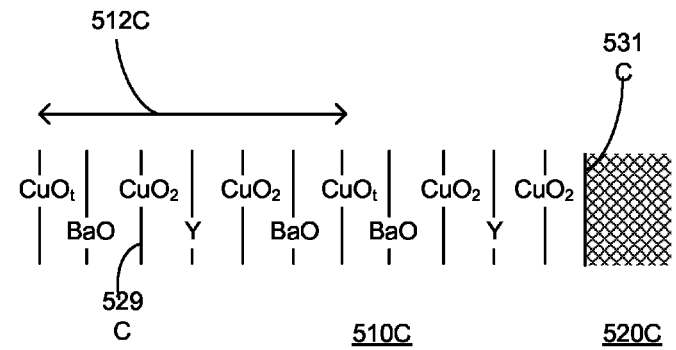

In FIG. 5C, the [001] direction 512C of the YBCO crystal structure can be at 90° angle relative to the interface 531C between the electrode 510C and the dielectric 520C. Each of the (001) atomic layers 529C can have a composition as illustrated in the figure. YBCO atoms adjacent to the interface can be all included into a $CuO_2$ layer of YBCO, such that the interfacial $CuO_2$ layer is adjacent to a Y layer of YBCO (i.e. the electrode 510C can terminate with $CuO_2YCuO_2$ unit). The $CuO_2$ layer can carry an excess negative surface charge (formally −2 per formula unit). A compensating positive charge, such as a screening charge, can form inside the electrode, creating a dipole layer that can decrease the electron barrier to the adjacent dielectric 520C and shift the dielectric CBM towards the electrode Fermi level, as in FIG. 4B. The excess negative charge of the $CuO_2$ layer can be overcompensated by the (formally+3 per formula unit) charge of the Y layer, so that the resulting excess positive charge can create an opposing dipole that may partially cancel out the band alignment shift. The resulting shift of the dielectric CBM towards the electrode Fermi level can be moderate, e.g. between 0.2 and 1.5 eV, such as around 1 eV.

Figure 5D:
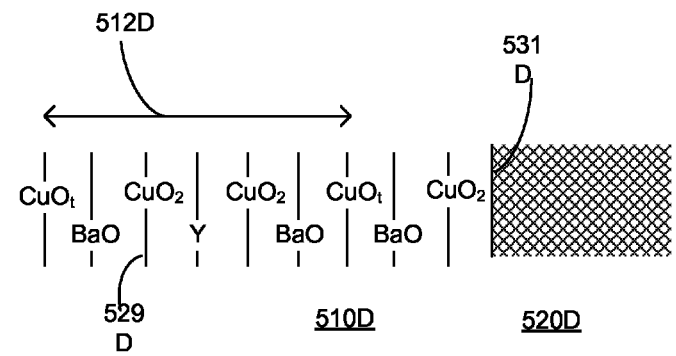

In FIG. 5D, the [001] direction 512D of the YBCO crystal structure can be at 90° angle relative to the interface 531D between the electrode 510D and the dielectric 520D. Each of the (001) atomic layers 529D can have a composition as illustrated in the figure. YBCO atoms adjacent to the interface can be all included into a $CuO_2$ layer of YBCO that is adjacent to a BaO layer of YBCO (i.e. the interface 531D is not immediately adjacent to a $CuO_2YCuO_2$ unit in electrode 510D). The $CuO_2$ layer can carry an excess negative surface charge (formally −2 per formula unit), that can be compensated primarily by the Thomas-Fermi-type screening, which can lead to a substantial shift of the dielectric CBM towards the electrode Fermi level, e.g. between 1 eV and 2 eV, such as 1.5 eV.

In some embodiments, methods to form dielectric stacks having low thermionic leakage current are disclosed. The methods can include using a YBCO-based material as the electrode adjacent to the dielectric. The methods can include forming a dipole layer at the electrode-dielectric interface, such as by influencing the relative orientation of the electrode-dielectric interface and the atomic layers of YBCO, so that the conduction band maximum of the dielectric is within a band gap of the YBCO. The composition of the electrode can be adjusted so that the conduction band maximum of the dielectric is within a band gap of the YBCO.

Figure 6:
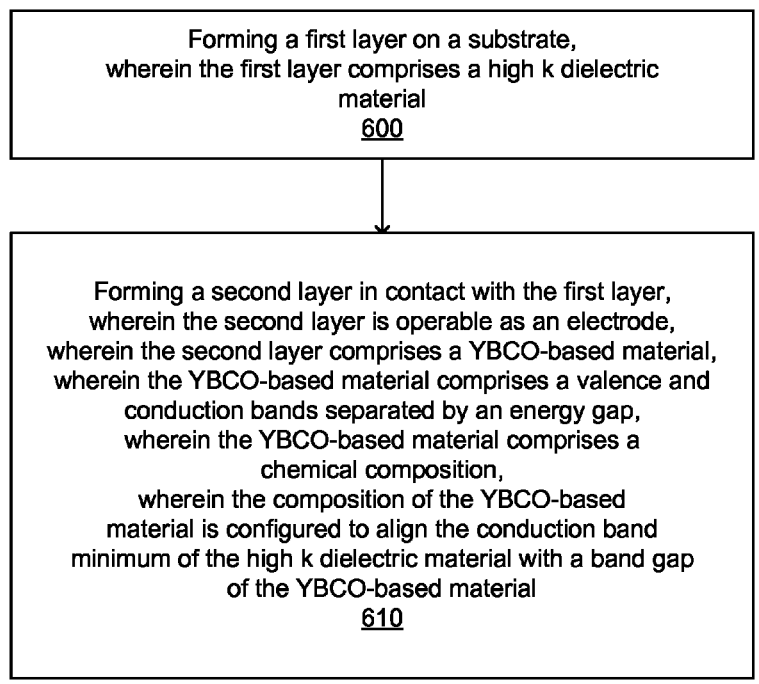
FIGS. 6-7 illustrate process flowcharts for forming dielectric stacks having low thermionic leakage current according to some embodiments, wherein the dielectric stacks include a YBCO electrode.

FIG. 6 illustrates a process flowchart for forming a dielectric stack having low thermionic leakage current according to some embodiments. In operation 600, a dielectric layer is formed on a substrate. The dielectric layer can be formed by a deposition process, such as an atomic layer deposition (ALD) process, a physical vapor deposition (PVD) process, a chemical vapor deposition (CVD) process, or any other processes. Treatments can be performed on the deposited dielectric layer, including an anneal process. The dielectric layer can include high dielectric constant material, such as a hafnium dioxide, zirconium dioxide, titanium dioxide, or a substantially undoped wide-band gap (more than 2 eV) semiconductor. In some embodiments, the dielectric layer can include a material with a small electron affinity, for example a material with electron affinity of less than 2 eV, e.g. such as zirconium dioxide or hafnium dioxide.

In operation 610, a layer of YBCO-based material is formed in contact with the dielectric layer. The YBCO-based material can be YBCO or a YBCO-based alloy with the composition chosen so that the conduction band minimum of the dielectric material is aligned with a band gap of the YBCO-based material. The YBCO-based material can be formed by a deposition process, such as a physical vapor deposition (PVD) process or a chemical vapor deposition (CVD) process. For example, the orientation of the YBCO atomic layers formed with PVD or CVD deposition could be at an arbitrary angle relative to the interface with the dielectric layer, e.g. similar to the orientation shown in FIG. 5A.

In some embodiments, a conductive layer can be formed on the YBCO-based layer. The conductive layer can be operable to increase the conductivity of the electrode. In some embodiments, the YBCO-based layer can be formed on the dielectric layer. Alternatively, the dielectric layer can be formed on the YBCO-based layer. Further, two YBCO-based layers can be formed, sandwiching the dielectric layer, and neither, or one, or both YBCO-based layers can contact one or more conductive layers that can be operable to increase the conductivity of the respective YBCO-based electrode.

Figure 7:
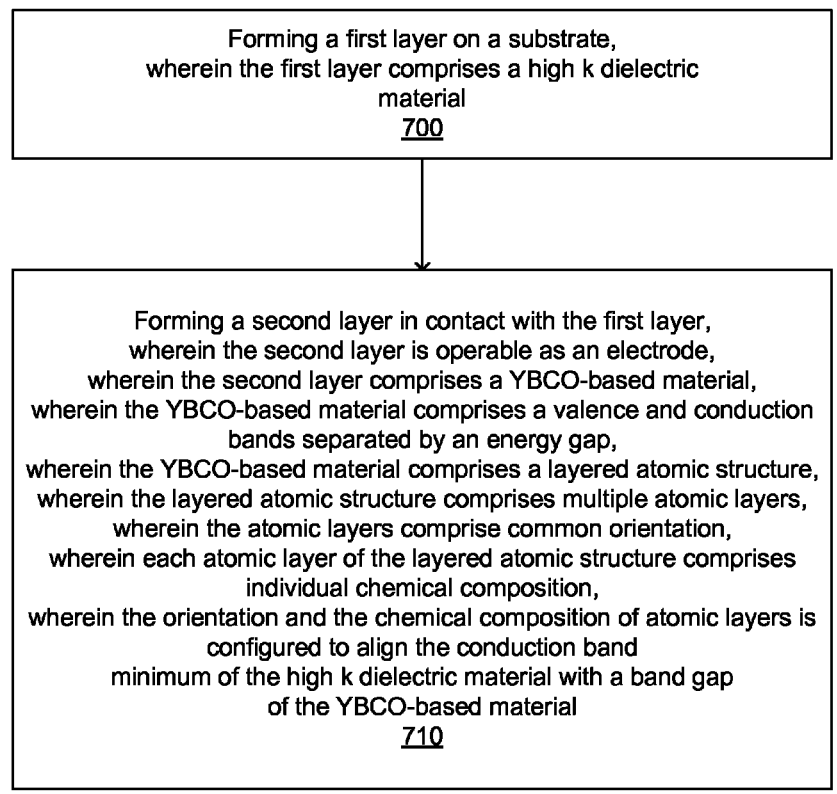

FIG. 7 illustrates a process flowchart for forming a dielectric stack having low thermionic leakage current according to some embodiments. In operation 700, a dielectric layer is formed on a substrate. The dielectric layer can be formed by a deposition process, such as an atomic layer deposition (ALD) process, a physical vapor deposition (PVD) process, a chemical vapor deposition (CVD) process, or any other processes. Treatments can be performed on the deposited dielectric layer, including an anneal process. The dielectric layer can include high dielectric constant material, such as a hafnium dioxide, zirconium dioxide, titanium dioxide, or a substantially undoped wide-band gap (more than 2 eV) semiconductor.

In operation 710, a layer of YBCO-based material is formed in contact with the dielectric layer by a method that controls the orientation and composition of the atomic layers of the YBCO-based material. For example, the YBCO-based material can be formed by an atomic layer deposition (ALD) process. For example, the YBCO atomic layers formed with ALD could be substantially parallel to the interface with the dielectric layer. The YBCO-based material can be YBCO or a YBCO-based alloy. Depending on the properties of the dielectric layer, such as the electron affinity and the tendency for the Fermi level pinning, the sequence, orientation and composition of the atomic layers can be adjusted so that the conduction band minimum of the dielectric material is aligned with a band gap of the YBCO-based material.

In some embodiments, the ALD sequence for operation 710 can start with depositing a substantially BaO layer, forming YBCO-based material with orientation similar to that shown in FIG. 5B. In some embodiments, the ALD sequence starting with deposition of a substantially BaO layer and forming $YBa_2Cu_3O_x$ at any of the composition in the range of x=6.35 to 7.0 can be used if a dielectric material formed in step 700 has electron affinity of less than 2 eV, such as zirconium dioxide or hafnium dioxide.

In some embodiments, the ALD sequence for operation 710 can start with depositing a $CuO_2$ layer followed by rare earth layer, such as a Y layer, and followed by a YBCO-based material with the orientation similar to that shown in FIG. 5D. In some embodiments, the ALD sequence starting with deposition of a $CuO_2$ layer followed by a rare earth layer and forming $YBa_2Cu_3O_x$ with composition around x=6.35 or with composition x<6.35 but x>6.0 can be used if a dielectric material formed in step 700 has a high electron affinity, such as equal or greater than 1.5 eV, e.g. such as titanium dioxide. In some embodiments, the electron affinity can be equal or less than 2.5 eV.

In some embodiments, the ALD sequence for operation 710 can start with depositing a $CuO_2$ layer followed by BaO layer, forming YBCO-based material with the orientation similar to that shown in FIG. 5C. In some embodiments, the ALD sequence starting with deposition of a $CuO_2$ layer followed by BaO layer and forming $YBa_2Cu_3O_x$ with composition around x=6.35 or with composition x<6.35 but x>6.0 can be used if a dielectric material formed in step 700 has an intermediate electron affinity, such as equal or greater than 1.5 eV.

In some embodiments, a conductive layer can be formed on the YBCO-based layer. The conductive layer can be operable to increase the conductivity of the electrode. In some embodiments, the YBCO-based layer can be formed on the dielectric layer. Alternatively, the dielectric layer can be formed on the YBCO-based layer. Further, two YBCO-based layers can be formed, sandwiching the dielectric layer, and neither, or one, or both YBCO-based layers can contact one or more conductive layers that can be operable to increase the conductivity of the respective YBCO-based electrode.

In some embodiments, electrodes that can include a narrow-band conductive material are disclosed, which can reduce the thermionic leakage across the dielectric.

Figure 8:
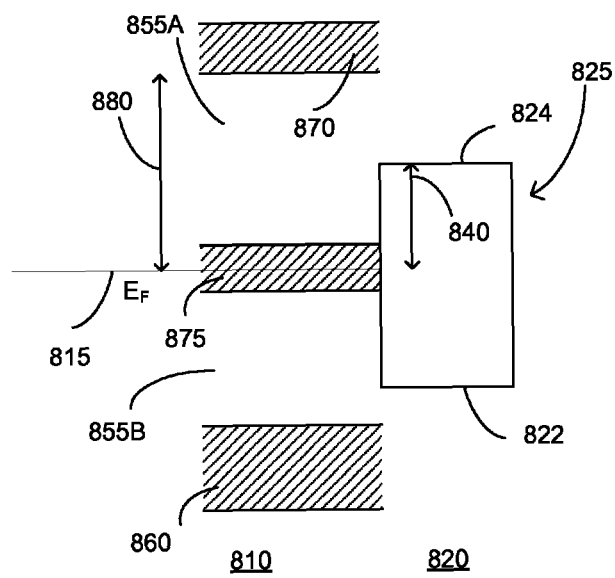
FIG. 8 illustrates a narrow-band conductive electrode adjacent to a dielectric according to some embodiments.

FIG. 8 illustrates a band diagram of a narrow-band conductive material electrode adjacent to a dielectric, according to some embodiments. The narrow-band conductive material 810 can be represented by multiple energy bands, which can include a valence band 860, a conduction band 870, and a narrow band 875, such as an impurity band or an intermediate conduction band inside a band gap. The narrow band 875 can be separated by multiple wide band gaps 855A, 855B from both the valence band 860 and the conduction band 870. The Fermi level 815 of the narrow-band conductive material 810 can lie within the narrow band 875. The dielectric 820 can be represented by the band gap 825, ranging from the VBM 822 of the dielectric to CBM 824 of the dielectric.

The position of the Fermi level and the relative alignment of the electrode and dielectric band structure can to be further adjusted, e.g. by doping the narrow-band conductive material, or by creating interfacial dipole layers at the electrode-dielectric interface. In some embodiments, the CBM 824 of dielectric 820 can be adjusted to lie within the band gap 855A of electrode 810. In some embodiments, the VBM 822 of dielectric 820 can be adjusted to lie within the band gap 855B of electrode 810. One having ordinary skills in the art can recognize that for a narrow-band conductive material that can have wide band gaps 855A, 855B and a work function comparable to that of regular metals, many choices of dielectric materials 820 can have both CBM and VBM simultaneously within the gaps 855A, 855B, without need for adjustment.

Since the band gap 855 is forbidden, the electrons in the electrode narrow band 875 will need at least an excitation energy 880 to pass through the dielectric 820. This excitation energy 880 can be much greater than the difference 840 between the conduction band minimum 824 and the Fermi level 815, e.g., $\Delta E = E_{CBM} - E_F$, which is the required excitation energy for conventional conductive materials such as metals. Thus, the electronic thermionic leakage through the dielectric 420 can be reduced, due to the requirement of higher excitation energy. One having ordinary skills in the art would understand that vertically flipping a band alignment diagram with respect to the Fermi level, one would interchange the characteristics related to the electron and the hole contributions. Thus, both the electronic and the hole components of thermionic leakage can be significantly reduced, since the leakage current is exponentially proportional to the excitation energy. Other leakage mechanisms may also be suppressed in some embodiments.

In some embodiments, the narrow-band conductive material can be formed on a conductive layer. The conductive layer can be operable to increase the conductivity of the electrode. In some embodiments, the dielectric layer can be formed on the narrow-band conductive material layer. Alternatively, the narrow-band conductive material layer can be formed on the dielectric layer. Further, two narrow-band conductive material layers can be formed, sandwiching the dielectric layer, and neither, or one, or both narrow-band conductive material layers can contact one or more conductive layers that can be operable to increase the conductivity of the respective narrow-band conductive electrode.

Figure 9:
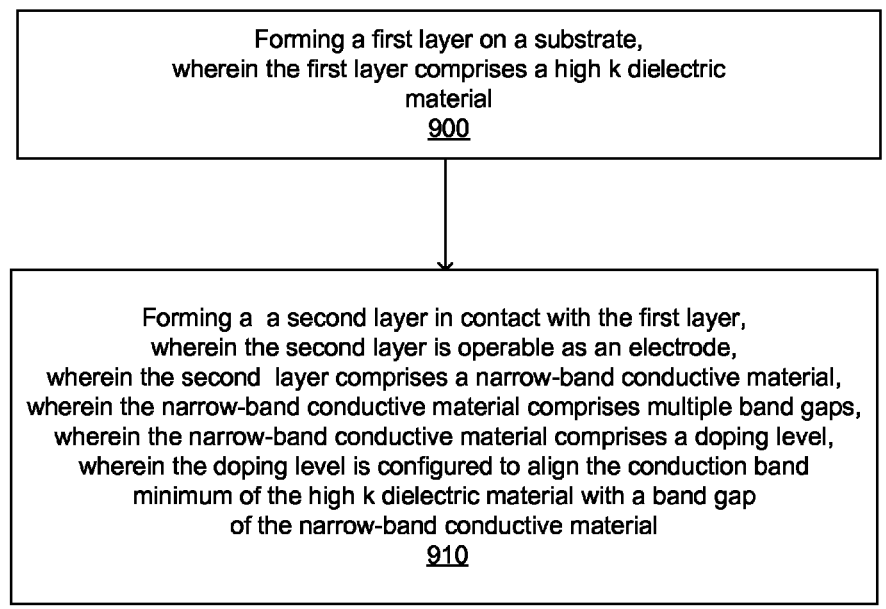
FIG. 9 illustrates process flowcharts for forming dielectric stacks having low thermionic leakage current according to some embodiments, wherein the dielectric stacks include a narrow-band conducting electrode.

FIG. 9 illustrates a process flowchart for forming a dielectric stack having low thermionic leakage current according to some embodiments. In operation 900, a dielectric layer is formed on a substrate. The dielectric layer can be formed by a deposition process, such as an atomic layer deposition (ALD) process, a physical vapor deposition (PVD) process, a chemical vapor deposition (CVD) process, or any other processes. Treatments can be performed on the deposited dielectric layer, including an anneal process. The dielectric layer can include high dielectric constant material, such as a hafnium dioxide, zirconium dioxide. In some embodiments, the dielectric layer can include a material with a small band gap, such as titanium dioxide, or a substantially undoped wide-band gap (more than 2 eV) semiconductor.

In operation 910, a layer of a narrow-band conductive material is formed on a substrate by a deposition process, such as the process described in application Ser. No. 13/722,931, filed on Dec. 20, 2012, which is herein incorporated by reference for all purposes, or by any other suitable process. The doping level can be adjusted to ensure that the Fermi level stays within the narrow "conduction" band. For example, the narrow-band conductive material could be formed using N and P plasma treatment of a $SiO_2$ film, as described in application Ser. No. 13/722,931, which is herein incorporated by reference for all purposes.

Although the foregoing examples have been described in some detail for purposes of clarity of understanding, the invention is not limited to the details provided.

There are many alternative ways of implementing the invention. The disclosed examples are illustrative and not restrictive.

What is claimed is:

1. A method comprising
    forming a first layer on a substrate,
        wherein the first layer comprises a high k dielectric material,
        wherein the high k dielectric material comprises a conduction band minimum;
    forming a second layer in contact with the first layer,
        wherein the second layer is operable as an electrode,
        wherein the second layer comprises an yttrium-barium-copper oxide (YBCO)-based material,
        wherein the YBCO-based material has a composition $YBa_2Cu_3O_x$, where x is between 6.35 and 7.0,
        wherein the YBCO-based material comprises a valence band and a conduction band, wherein the valence band and the conduction band are separated by a band gap,
        wherein the YBCO-based material comprises a chemical composition,
        wherein the chemical composition is configured to position the conduction band minimum within the band gap.

2. A method as in claim 1 wherein the high k material comprises at least one of $TiO_2$, $ZrO_2$ or $HfO_2$.

3. A method as in claim 1 wherein the YBCO-based material comprises an alloy material with at least 50 at. % $YBa_2Cu_3O_x$.

4. A method as in claim 1 wherein the high k material comprises a material with electron affinity greater than 2 eV.

5. A method as in claim 4 wherein the high k material with electron affinity greater than 2 eV comprises $TiO_2$.

* * * * *